United States Patent
West et al.

(10) Patent No.: US 6,894,481 B2
(45) Date of Patent: May 17, 2005

(54) METHOD AND APPARATUS FOR BRINGING LASER CHIPS TO A MEASUREMENT POSITION

(75) Inventors: Roland West, Järfälla (SE); Mats Jensen, Hallstahammar (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 10/480,030

(22) PCT Filed: Jun. 4, 2002

(86) PCT No.: PCT/SE02/01067
§ 371 (c)(1),
(2), (4) Date: Jun. 2, 2004

(87) PCT Pub. No.: WO02/101402
PCT Pub. Date: Dec. 19, 2002

(65) Prior Publication Data
US 2004/0246009 A1 Dec. 9, 2004

(30) Foreign Application Priority Data
Jun. 12, 2001 (SE) ............................. 0102113

(51) Int. Cl.[7] ....................... G01R 31/302; G01B 11/00
(52) U.S. Cl. ................. 324/158.1; 324/750; 356/400
(58) Field of Search ............................. 324/750–752, 324/158.1; 382/141, 145, 149, 151; 356/394, 400

(56) References Cited
U.S. PATENT DOCUMENTS

| 6,111,424 A | * | 8/2000 | Bosacchi | .................. 324/770 |
| 6,208,419 B1 | * | 3/2001 | Yamamoto et al. | ......... 356/400 |
| 6,369,884 B1 | * | 4/2002 | Yamamoto et al. | ......... 356/121 |
| 6,501,260 B1 | * | 12/2002 | Hu et al. | ................. 324/158.1 |

\* cited by examiner

Primary Examiner—David Zarneke
Assistant Examiner—Russell M. Kobert

(57) ABSTRACT

An apparatus for measuring output light intensity from laser chips mounted on respective carriers on a fixture, comprises a control unit for moving the fixture to in turn bring the chips to a measurement station, and a TV camera and a NIR camera both connected to a vision system for determining x and y coordinates of objects viewed by the TV camera and the NIR camera, respectively. The control unit is adapted to move the fixture to bring the respective chip in front of the TV camera to determine the coordinates of the chip on the fixture, move the fixture in response to the coordinates of the chip on the fixture to bring the chip in front of the NIR camera to determine the coordinates of a point of maximum light intensity from the ignited chip, and move the fixture in response to the coordinates of the point of maximum light intensity to bring the chip to the measurement station.

5 Claims, 1 Drawing Sheet

METHOD AND APPARATUS FOR BRINGING LASER CHIPS TO A MEASUREMENT POSITION

TECHNICAL FIELD

The invention relates generally to laser chips and more specifically to a method and an apparatus for bringing a population of manufactured laser chips to a measurement position to select good laser chips, i.e. laser chips that fulfil an output light intensity requirement.

BACKGROUND OF THE INVENTION

Manufactured laser chips are mounted on carriers. To test whether or not the laser chips fulfil the requirement on output light intensity, the carriers with the chips are placed on a fixture that is moved to in turn bring the chips to a measurement station. This is a time consuming process in that the location of the point of maximum output light intensity of a laser chip on a carrier is unknown. Therefore, at the measurement station, each chip has to be scanned in order to locate the point of maximum output light intensity before the light intensity can be measured. If for some reason a chip is missing in its expected position on the fixture, the scanning for the point of maximum output light intensity for that chip can continue until an operator notices the situation.

SUMMARY OF THE INVENTION

The object of the invention is to more quickly locate the point of maximum output light intensity of laser chips on carriers on a fixture.

This is attained by the method according to the invention of measuring output light intensity from laser chips mounted on respective carriers on a fixture, comprising moving the fixture to in turn bring the chips to a measurement station in that, for each chip, the fixture is first moved to bring the chip in front of a TV camera connected to a vision system that is adapted to determine x and y coordinates of objects viewed by the TV camera, the coordinates of the chip on the fixture are determined by means of the vision system, the fixture is then moved in response to the coordinates determined by the vision system to bring the chip in front of a NIR camera connected to the vision system that is adapted to determine also x and y coordinates of objects viewed by the NIR camera, the laser chip is ignited, and the x and y coordinates of the point of maximum light intensity from the chip are determined by means of the vision system, whereupon the fixture is moved in response to the determined coordinates of the point of maximum light intensity to bring the chip to the measurement station to measure the light intensity.

This is also attained by the apparatus according to the invention for measuring output light intensity from laser chips mounted on respective carriers on a fixture, comprising a control unit for moving the fixture to in turn bring the chips to a measurement station (3), a TV camera and a NIR camera both connected to a vision system for determining x and y coordinates of objects viewed by the TV camera and the NIR camera, respectively. The control unit is adapted to move the fixture to bring the respective chip in front of the TV camera to determine the coordinates of the chip on the fixture, move the fixture in response to the coordinates of the chip on the fixture to bring the chip in front of the NIR camera to determine the coordinates of a point of maximum light intensity from the ignited chip, and move the fixture in response to the coordinates of the point of maximum light intensity to bring the chip to the measurement station.

By the method and the apparatus according to the invention, the process of locating the point of maximum output light intensity of laser chips on carriers on a fixture will be much quicker than the processes used today.

DETAILED DESCRIPTION OF THE DRAWINGS

Figure 1:
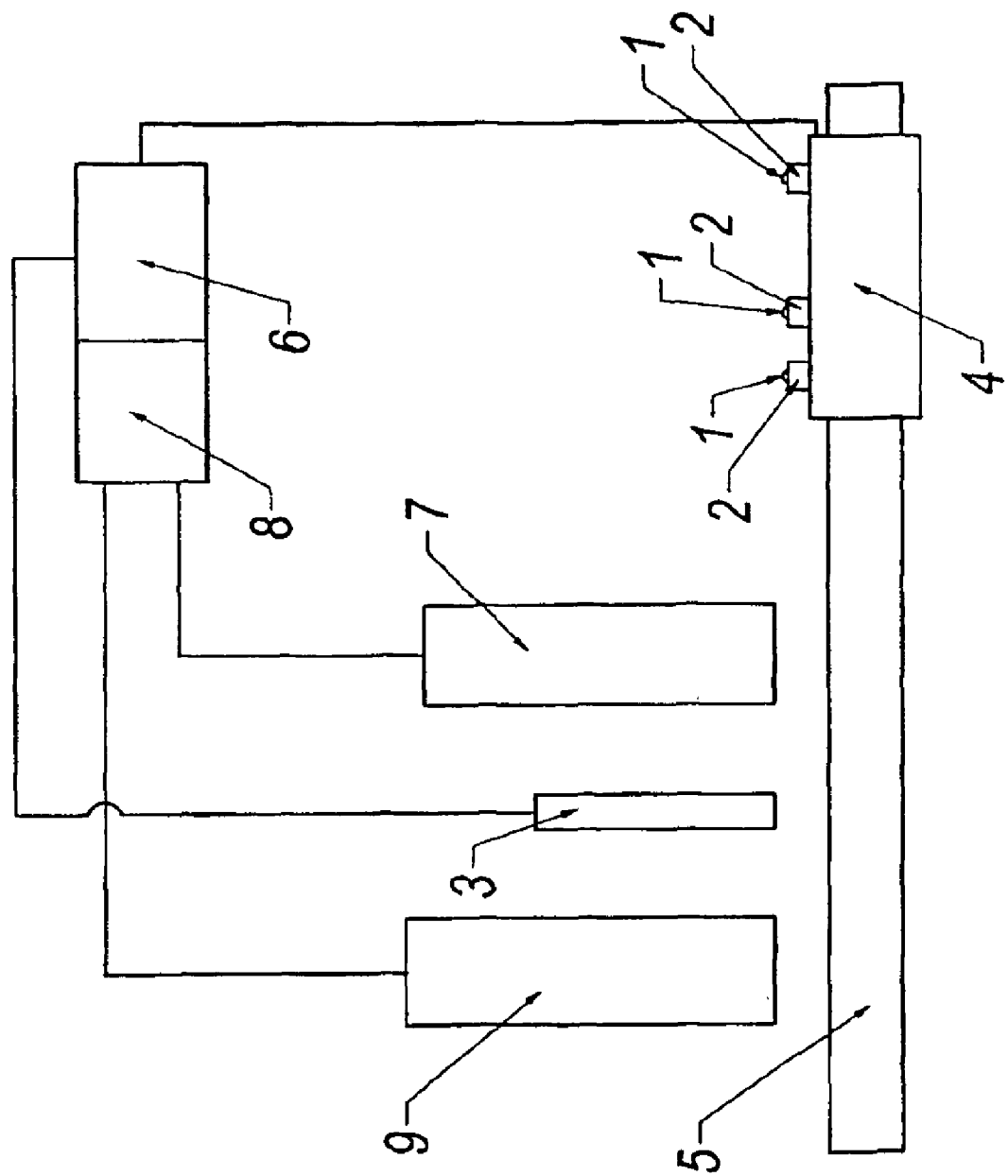
FIG. 1 is a schematic illustration of an embodiment of an apparatus according to the invention.

FIG. 1 is a schematic illustration of an embodiment of an apparatus for bringing laser chips 1 mounted on respective carriers 2 to a measurement station 3 to measure output light intensity of the chips 1.

In a manner known per se, the carriers 2 with the chips 1 are mounted on a fixture 4, and the fixture 4 is moved to in turn bring the chips 1 to the measurement station 3.

In the embodiment shown, the fixture 4 is driven by means of a motor (not shown), e.g. a linear motor, along a rod 5 under control of a central control and signal processing unit 6.

In accordance with the invention, the fixture 4 is first moved along the rod 5 to bring the first chip 1 in front of a TV camera 7. The TV camera 7 is connected to a vision system 8 that is adapted to determine x and y coordinates of objects viewed by the TV camera 7, and that is connected to the central control and signal processing unit 6.

By means of the vision system 8, the coordinates of the chip 1 on the fixture 4 is determined and transferred to the central control and signal processing unit 6.

If a chip is missing on the fixture, this is detected by the vision system and the fixture is moved to bring the next chip in front of the TV camera.

In response to the coordinates determined by the vision system 8, the central control and signal processing unit 6 controls the motor (not shown) to move the fixture 4 such that the chip 1 is brought in front of a near infra-red (NIR) camera 9. The NIR camera 9 is also connected to the vision system 8 that is adapted to determine x and y coordinates of objects viewed by the NIR camera 9.

In accordance with the invention, the laser chip 1 is now ignited, and the x and y coordinates of the point of maximum light intensity from the chip 1 as viewed by the NIR camera 9 is now determined by means of the vision system 8.

In response to the determined coordinates of the point of maximum light intensity, the fixture 4 is moved such that the chip 1 is brought to the measurement station 3 to measure the light intensity.

The measurement station 3 can be e.g. an optical fibre connected to an input terminal of the central control and signal processing unit 6.

Depending on whether the maximum light intensity of the chip 1 is above or below a predetermined threshold, the chip 1 is accepted or discarded.

As should be apparent from the above, it is not necessary to scan a "window" in order to locate the point of maximum light intensity of a chip and, consequently, the apparatus according to the invention is quicker than the apparatuses known so far.

What is claimed is:

1. A method of measuring output light intensity from laser chips mounted on respective carriers on a fixture, comprising the steps of:

moving the fixture to in turn bring the chips to a measurement station;

wherein, for each chip, moving the fixture to bring the chip in front of a TV camera connected to a vision system for determining x and y coordinates of objects viewed by the TV camera;

determining the coordinates of the chip on the fixture by means of the vision system;

moving the fixture in response to the coordinates of the chip on the fixture to bring the chip in front of a NIR camera connected to the vision system for determining x and y coordinates of objects viewed by the NIR camera;

igniting the laser chip;

determining the coordinates of a point of maximum light intensity from the chip by means of the vision system; and moving the fixture in response to the coordinates of the point of maximum light intensity to bring the chip to the measurement station to measure the light intensity.

2. An apparatus for measuring output light intensity from laser chips mounted on respective carriers on a fixture comprising;

a control unit for moving the fixture to in turn bring the chips to a measurement station;

a TV camera;

a NIR camera both connected to a vision system for determining x and y coordinates of objects viewed by the TV camera and the NIR camera, and that the control unit is adapted to move the fixture to bring the respective chip in front of the TV camera to determine the coordinates of the chip on the fixture, move the fixture in response to the coordinates of the chip on the fixture to bring the chip in front of the NIR camera to determine the coordinates of a point of maximum light intensity from the ignited chip, and move the fixture in response to the coordinates of the point of maximum light intensity to bring the chip to the measurement station.

3. The apparatus according to claim 2, wherein the measurement station, the TV camera and the NIR camera are arranged along a rod on which the fixture is moved.

4. The apparatus according to claim 3, further comprising a motor to drive the fixture along the rod.

5. The apparatus according to claim 4, wherein the motor is a linear motor.

* * * * *